United States Patent
He et al.

(10) Patent No.: US 12,352,795 B2
(45) Date of Patent: Jul. 8, 2025

(54) METHOD, DEVICE AND MEDIUM FOR CALCULATING RADIATION FIELD OF SATELLITE-BORNE ARRAY ANTENNA

(71) Applicant: ZHEJIANG LAB, Zhejiang (CN)

(72) Inventors: Tong He, Hangzhou (CN); Xuewei Zhang, Hangzhou (CN)

(73) Assignee: ZHEJIANG LAB, Hangzhou (CN)

(*) Notice: Subject to any disclaimer, the term of this patent is extended or adjusted under 35 U.S.C. 154(b) by 0 days.

(21) Appl. No.: 18/416,899

(22) Filed: Jan. 19, 2024

(65) Prior Publication Data

US 2025/0052801 A1  Feb. 13, 2025

(30) Foreign Application Priority Data

Aug. 10, 2023  (CN) .......................... 202311001038.6

(51) Int. Cl.
  *G01R 29/10*  (2006.01)
  *G01R 29/08*  (2006.01)
  *H01Q 1/28*  (2006.01)

(52) U.S. Cl.
  CPC ......... *G01R 29/10* (2013.01); *G01R 29/0892* (2013.01); *H01Q 1/288* (2013.01)

(58) Field of Classification Search
  CPC ..... G01R 29/10; G01R 29/0892; H01Q 1/288
  USPC ........................................................ 324/612
  See application file for complete search history.

(56) References Cited

U.S. PATENT DOCUMENTS

| 10,651,920 | B1 | 5/2020 | Struhsaker et al. |
| 11,061,428 | B2* | 7/2021 | Qi .............................. G06F 1/00 |
| 2005/0099353 | A1* | 5/2005 | Jones ....................... H01Q 5/42 343/705 |

(Continued)

FOREIGN PATENT DOCUMENTS

| CN | 102998540 A | 3/2013 |
| CN | 104615836 A | 5/2015 |

(Continued)

OTHER PUBLICATIONS

First Office Action(CN202311001038.6); Date of Mailing: Sep. 14, 2023.

(Continued)

*Primary Examiner* — Christopher P McAndrew
(74) *Attorney, Agent, or Firm* — Wiersch Law Group

(57) ABSTRACT

Disclosed is a method and a device for calculating a radiation field of satellite-borne array antennas. comprising: calculation of a kernel function of an antenna: calculating the kernel function of a very-low-frequency antenna in an ionospheric environment; calculation of an antenna current distribution: establishing and solving N current integral equations satisfied by the array antennas to obtain the current distribution of each antenna in the array; calculation of the radiation fields of the array antennas: calculating and summing the radiation fields of all antenna elements to obtain the radiation field of the array antennas; calculation of an array factor: analyzing a propagation phase difference between the $i^{th}$ antenna and the first antenna, and calculating the array factor of the array antennas accordingly, further simplifying the radiation field of the array antennas. The present disclosure has advantages of less calculation time consumption and high accuracy.

4 Claims, 4 Drawing Sheets

(56) References Cited

U.S. PATENT DOCUMENTS

2019/0027836 A1    1/2019   Qi et al.

FOREIGN PATENT DOCUMENTS

| CN | 104992001 A | 10/2015 |
| CN | 112886277 A | 6/2021 |
| CN | 113673070 A | 11/2021 |
| CN | 115902344 A | 4/2023 |
| WO | 2018158472 A1 | 9/2018 |

OTHER PUBLICATIONS

Double-neutralization-lines-decoupling-design-for-tri-band-MIMO.
Notice Of Allowance(CN202311001038.6); Date of Mailing: Oct. 11, 2023.

* cited by examiner

METHOD, DEVICE AND MEDIUM FOR CALCULATING RADIATION FIELD OF SATELLITE-BORNE ARRAY ANTENNA

CROSS-REFERENCE TO RELATED APPLICATIONS

The present application claims priority to Chinese Patent Application No. 202311001038.6, filed on Aug. 10, 2023, the content of which is incorporated herein by reference in its entirety.

TECHNICAL FIELD

The present disclosure relates to the technical field of antenna arrays, in particular to a method, a device and a medium for calculating the radiation field of satellite-borne array antennas.

BACKGROUND

For a satellite-borne very-low-frequency (VLF) transmission system, it is very important to improve the radiation efficiency of satellite-borne antennas, and one of the decisive factors is the current moment of antennas. However, the current moment will be limited by the limited current per unit area, and the long antenna will increase the difficulty of attitude control, both of which will lead to the increase of the cost of satellite launch. A possible alternative to the traditional single antenna is to use multiple space antennas to form a satellite-borne antenna array to improve the current moment and radiation efficiency. For a multi-element antenna array, different from isolated wire antennas located in ionospheric plasma, each antenna will not only be affected by the radiation field generated by its own current, but also by the electromagnetic field generated by other antenna currents in the array. This mutual coupling effect of the array will change the original current distribution of each antenna, and then affect the radiation field generated by the array. In addition, by controlling the feed phase of the radiating elements in the array to change the direction of the maximum value of the antenna pattern, the satellite-borne phased array antennas with a spatial beam shaping function is realized to a certain extent, which is expected to greatly improve the emission efficiency of the satellite-borne VLF transmission system.

The calculation of the radiation field and array factor of satellite-borne array antennas has not attracted enough attention. When calculating the radiation field of the array antennas, the mutual coupling between different antenna elements and their propagation phase relationship are the key factors that must be considered. At the same time, due to the influence of the earth's magnetic field, the ionosphere where the satellite-borne transmitting antennas are located will show strong anisotropy in very-low-frequency bands. At present, the research on the calculation of the radiation field and array factor of satellite-borne array antennas is not enough, especially considering the ionospheric anisotropy and array mutual coupling effect, there is no specific and effective method to calculate the radiation field and array factor of satellite-borne array antennas with different array elements.

SUMMARY

In view of the problems existing in the prior art, the present disclosure provides a method, a device and a medium for calculating the radiation field of satellite-borne array antennas, which can effectively solve the problem of calculating the radiation field and the array factor of satellite-borne VLF array antennas located in the ionosphere.

In order to achieve the above object, the present disclosure adopts the following technical solution: a method for calculating a radiation field of satellite-borne array antennas, including the following steps:

(1) Solving a very-low-frequency radiation field excited by an electric dipole in an ionosphere environment, and calculating a kernel function of a very-low-frequency antenna in the ionosphere environment according to a relative position relationship between an antenna current source point and an observation point;

(2) Establishing and solving N current integral equations satisfied by the array antennas in the ionosphere environment by using the kernel function obtained in step (1) according to a boundary condition, thereby obtaining a current distribution of each antenna in an array.

(3) Calculating the radiation field of each antenna in the array according to the kernel function obtained in step (1) and the current distribution obtained in step (2), and obtaining the radiation field of the array antennas by summing the radiation fields of all antennas.

Further, the ionosphere in the step (1) is used as a uniform and infinite anisotropic plasma medium in a very-low-frequency band; by calculating a relative transverse propagation distance $\Delta\rho$ and a relative longitudinal propagation distance $\Delta z$ between the observation point and the electric dipole, and performing a three-dimensional Fourier transform on a Maxwell's equation, the radiation field generated by the electric dipole at any position can be obtained, which is the kernel function $G(\Delta\rho, \Delta z)$ of the very-low-frequency antenna in the ionospheric environment.

Further, the array antennas consist of N linear antennas which have a same size, parallel to each other and arranged in an arbitrary manner.

Further, the N current integral equations satisfied by the array antennas in the ionosphere environment are established and solved according to the boundary condition, specifically: the tangential electric field on the surface of each antenna is a sum of the combined action of the N antennas and satisfies the N current integral equations at the same time; since the antennas can be regarded as good conductors, electric field tangential components on the surfaces of the antennas should be zero everywhere according to the boundary condition, and the electric field tangential component at an antenna feed point is equal to a feed voltage, the current integral equation satisfied by a $k^{th}$ antenna in the array is:

$$\frac{\eta}{4\pi k_0 \varepsilon_3} \int_{-h}^{h} \sum_{i=1}^{N} G(b_{ki}, z-z') I_i(z') dz' = -V_k \delta(z)$$

where $\eta$ represents a wave impedance in vacuum, $k_0$ represents a wave number in vacuum, $\varepsilon_3$ represents a diagonal component of an ionospheric dielectric constant matrix, $I_i$ represents a current distribution of an $i^{th}$ antenna, $V_k$ represents the feed voltage of the $k^{th}$ antenna, h represents half an antennas length, $b_{ki}$ represents a transverse distance between the $k^{th}$ antenna and the $i^{th}$ antenna, z represents a longitudinal height of the observation point, z' represents a longitudinal height of the antenna current source point and $\delta(z)$ represents a Dirac function.

Further, in step (2), the N current integral equations satisfied by the array antennas are solved by using a moment method to obtain the current distribution $I_i$ of each antenna in the array.

Further, in step (3), the radiation field of the array antennas is a sum of the radiation fields of the antennas in the array, and the radiation field generated by each antenna is obtained by multiplying the current distribution by the kernel function and integrating an antenna length, and accordingly the radiation field of the array antennas can be expressed as:

$$E_{array} = \frac{\eta}{4\pi k_0 \varepsilon_3} \int_{-h}^{h} \sum_{i=1}^{N} G(\Delta\rho_i, \Delta z_i) I_i(z') dz'$$

where $\Delta\rho_i$ and $\Delta z_i$ are a relative transverse propagation distance and a relative longitudinal propagation distance between the $i^{th}$ antenna and the observation point, $E_{array}$ represents the radiation field of the array antennas, and a corresponding field component thereof is consistent with that represented by the kernel function G.

Further, the method further includes a step of calculating an array factor to simplify the radiation field of the array antennas obtained in step (3). The step is specifically as follows: according to current phases of the antennas and the relative propagation distance from each antenna element to the observation point, a propagation phase difference between the $i^{th}$ antenna and a first antenna is analyzed, and the array factor of the array antennas is calculated accordingly, thus simplifying the expression of the radiation field of the array antennas.

Further, the array factor A is a sum of propagation phase difference terms of various antenna elements in the array relative to the first antenna, and is expressed as:

$$A = \sum_{i=1}^{N} \exp(j\Delta\gamma_i)$$

where $\Delta\gamma_i$ is the propagation phase difference between the $i^{th}$ antenna and the first antenna, and j represents an imaginary part symbol; the expression of the radiation field of the array antennas is simplified and a computational complexity is reduced by using the array factor; a simplified expression is:

$$E_{array} = \frac{\eta}{4\pi k_0 \varepsilon_3} \times E_1 \times A$$

where $$E_1 = \int_{-h}^{h} G(\Delta\rho_1, \Delta z_1) I_1(z') dz'$$

is the radiation field generated by the first antenna in the array.

A device for calculating a radiation field of satellite-borne array antennas includes one or more processors for implementing the above method for calculating a radiation field of satellite-borne array antennas.

A computer-readable storage medium stores a program. When executed by a processor, the program is configured to implement the above method for calculating a radiation field of satellite-borne array antennas.

The present disclosure has the following beneficial effects:

(1) An effective calculation method of the radiation field of satellite-borne array antennas is proposed, and the radiation field of the satellite-borne array antennas is simplified by combining the array factor, which reduces the calculation complexity, consumes less time and has high accuracy, and can provide theoretical guidance and basis for the practical engineering application of satellite-borne VLF array antennas.

(2) The method is used for high-precision calculation of the radiation field and array factor of satellite-borne VLF array antennas, and the radiation characteristics of satellite-borne phased array antennas are evaluated by accurately calculating the radiation field of the array antennas, thus providing theoretical support for achieving the best performance of array antennas.

(3) Aiming at the difficulties caused by ionospheric anisotropy in very-low-frequency bands, such as complicated mathematical processing and slow integration convergence, a method for accurately calculating the radiation field and array factor of satellite-borne VLF array antennas is innovatively proposed by using various analytical and numerical tools. This method fills the gap in the calculation method of radiation field and array factor of array antennas under anisotropic conditions to some extent, and has the advantages of a clear physical meaning, less calculation time and high calculation accuracy, and can be used in analysis and computation in practical satellite-borne engineering applications.

BRIEF DESCRIPTION OF DRAWINGS

In order to explain the technical solutions in the embodiments of the present disclosure more clearly, the drawings needed in the description of the embodiment will be briefly introduced below. Obviously, the drawings in the following description are only some embodiments of the present disclosure. For those skilled in the art, other drawings can be obtained according to these drawings without any creative work.

DESCRIPTION OF EMBODIMENTS

Reference will now be made in detail to exemplary embodiments, examples of which are illustrated in the accompanying drawings. When the following description refers to the drawings, unless otherwise indicated, the same numbers in different drawings indicate the same or similar elements. The embodiments described in the following exemplary embodiments do not represent all embodiments consistent with the present disclosure. Rather, they are merely examples of devices and methods consistent with some aspects of the present disclosure as detailed in the appended claims.

The present disclosure will be described in detail with reference to the attached drawings. In the case of no conflict, the features in the following embodiments and implementations can be combined with each other.

Example 1

The present disclosure relates to a method for calculating the radiation field of satellite-borne array antennas, which includes the following steps:

(1) Calculation of antenna kernel function: the ionosphere is regarded as a uniform and infinite anisotropic plasma medium in a very-low-frequency band, and the expression of the radiation field of an electric dipole is obtained through a three-dimensional Fourier transform; the transverse propagation distance and longitudinal propagation distance between the electric dipole and observation point can be defined as $\rho$ and z respectively; next, the electric dipole is moved away from the origin of the coordinate system, and by calculating the relative transverse propagation distance $\Delta\rho$ and relative longitudinal propagation distance $\Delta z$ between the observation point and the electric dipole, and then substituting them into the expression of the primary radiation field, the radiation field generated by the electric dipole at any position can be obtained, which is the kernel function $G(\Delta\rho, \Delta z)$ of the very-low-frequency antenna in the ionosphere.

Figure 1:
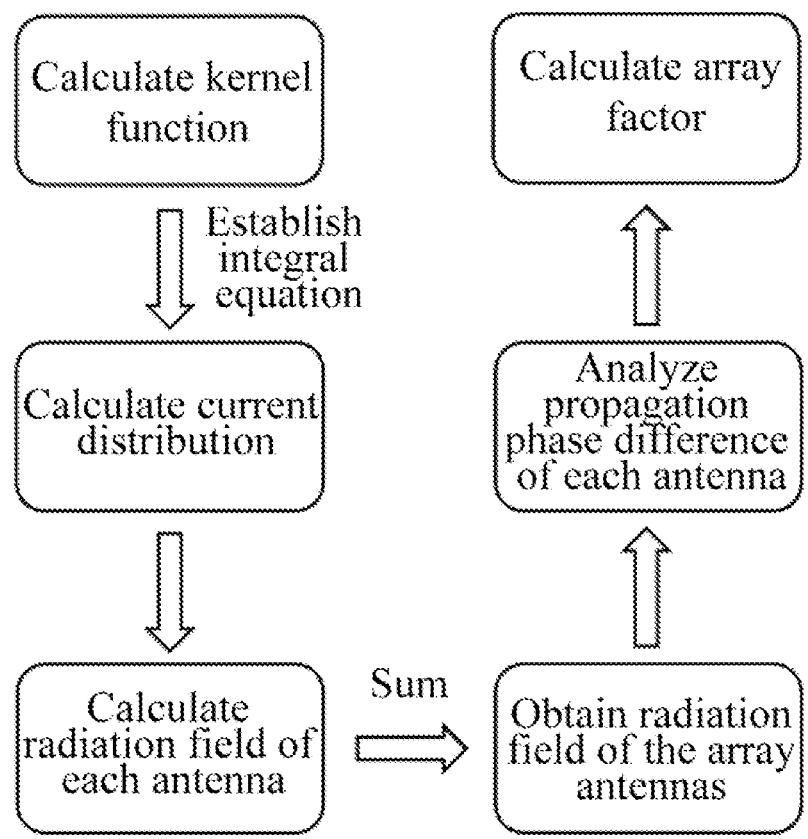
FIG. 1 is a schematic diagram of the implementation flow of this method.
Figure 2:
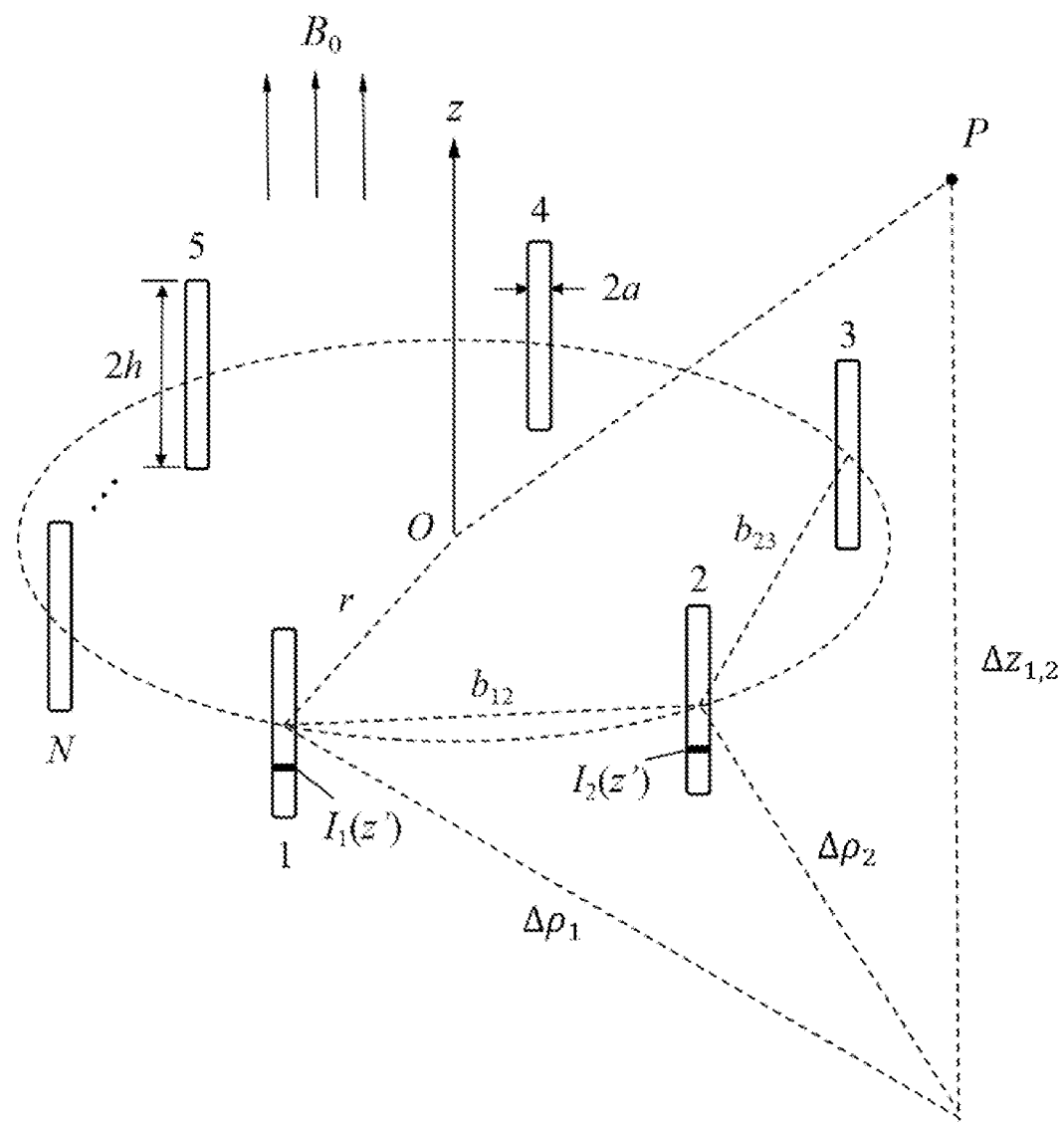
FIG. 2 is a diagram of the structural labeling of the array antennas and its relative position relationship with the observation point.

(2) Calculation of antenna current distribution: the array antennas in this embodiment consist of N parallel linear antennas which have the same size, and the antenna elements are arranged in such a way that the centers of all antennas are located on the circumference with radius r, as shown in FIG. 2, where a represents the radius of the antenna, h represents half the antenna length, $B_0$ represents the strength of the geomagnetic field, $b_{ki}$ represents the horizontal distance between the $k^{th}$ antenna and the $i^{th}$ antenna, z represents the vertical height of the observation point, z' represents the vertical height of the antenna current source point, $\bar{\varepsilon}$ represents a dielectric constant matrix of the ionosphere, $\varepsilon_0$ represents a dielectric constant in vacuum, and $\varepsilon_1$ and $\varepsilon_3$ are the diagonal components of the ionosphere dielectric constant matrix, $\varepsilon_2$ is an off-diagonal component of the ionosphere dielectric constant matrix, j represents the imaginary part symbol, and $I_i(z')$ represents the current distribution of the $i^{th}$ antenna; the tangential electric field on the surface of each antenna is the sum of the combined action of N antennas and satisfies N current integral equations at the same time;

$$\bar{\varepsilon} = \varepsilon_0 \begin{bmatrix} \varepsilon_1 & -j\varepsilon_2 & 0 \\ j\varepsilon_2 & \varepsilon_1 & 0 \\ 0 & 0 & \varepsilon_3 \end{bmatrix}$$

By using the kernel function obtained in step (1), N current integral equations satisfied by the array antennas in the ionosphere environment are established and solved according to the boundary condition. Because the antenna can be regarded as a good conductor, the tangential component of the electric field on the antenna surface should be zero everywhere according to the boundary condition, and the tangential component of the electric field at the antenna feed point should be approximately equal to the feed voltage, and accordingly the current integral equation satisfied by the $k^{th}$ antenna in the array is as follows:

$$\frac{\eta}{4\pi k_0 \varepsilon_3} \int_{-h}^{h} \sum_{i=1}^{N} G(b_{ki}, z-z') I_i(z') dz' = -V_k \delta(z)$$

where $\eta$ represents the wave impedance in vacuum, $k_0$ represents the wave number in vacuum, $V_k$ represents the feed voltage of the $k^{th}$ antenna, and $\delta(z)$ represents a Dirac function; next, the current distribution $I_i$ of each antenna in the array can be obtained by solving the N current integral equations satisfied by the array antennas with numerical tools such as the moment method.

(3) Calculation of radiation field of array antenna: according to the kernel function obtained in step (1) and the current distribution obtained in step (2), the radiation field generated by each antenna can be obtained by multiplying the current distribution by the kernel function and integrating the antenna length; by summing the radiation fields of all antennas, the radiation field of array antennas can be obtained, which is expressed as:

$$E_{array} = \frac{\eta}{4\pi k_0 \varepsilon_3} \int_{-h}^{h} \sum_{i=1}^{N} G(\Delta\rho_i, \Delta z_i) I_i(z') dz'$$

where $\Delta\rho_i$ and $\Delta z_i$ are the relative transverse propagation distance and relative longitudinal propagation distance between the $i^{th}$ antenna and the observation point P, as shown in FIG. 2, $E_{array}$ represents the radiation field of the array antennas, and its corresponding field component is consistent with that represented by the kernel function.

Example 2

Based on the radiation field of the array antennas obtained in Example 1, this example further simplifies the radiation field of the array antennas by calculating the array factor.

Figure 3:
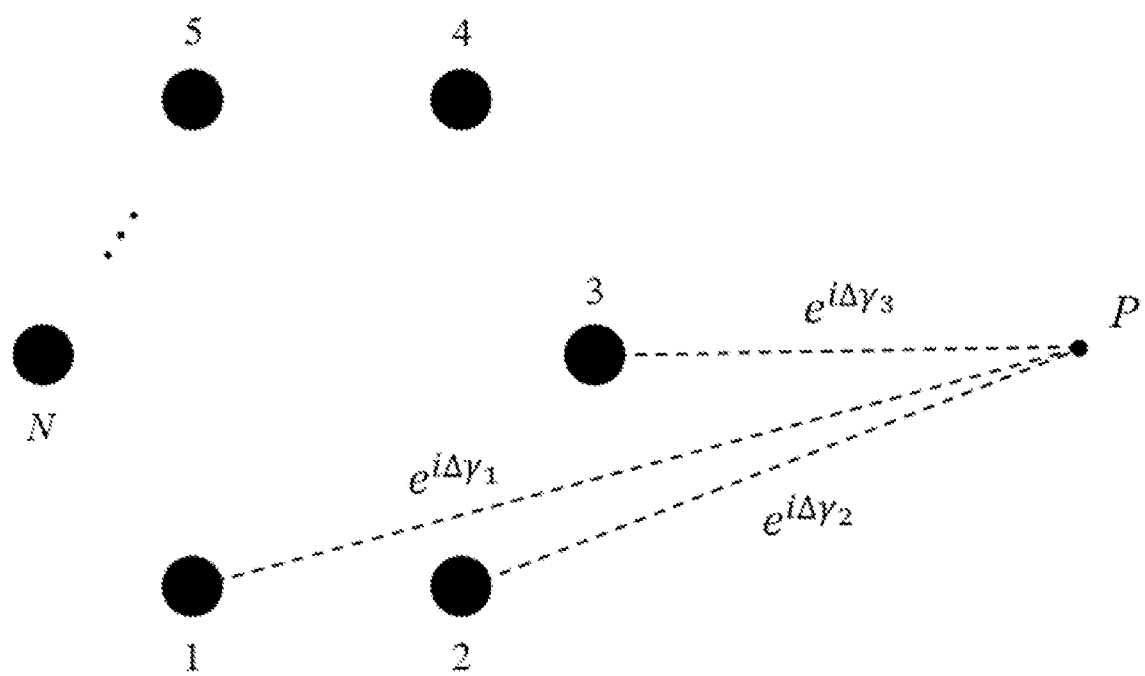
FIG. 3 is a diagram of the propagation phase difference of each antenna element relative to the first antenna.

Calculation of the array factor: according to the current phase of the antenna and the relative propagation distance from each antenna element to the observation point, the propagation phase difference between the $i^{th}$ antenna and the first antenna relative to the observation point P is analyzed, as shown in FIG. 3, and the array factor A of the array antennas is calculated accordingly, where the array factor A is the sum of the propagation phase difference terms of various antenna elements in the array relative to the first antenna, which is expressed as $$A = \sum_{i=1}^{N} \exp(j\Delta\gamma_i),$$

where $\Delta\gamma_i$ is the propagation phase difference between the $i^{th}$ antenna and the first antenna; by using the array factor, the expression of the radiation field of the array antennas can be further simplified and the computational complexity can be reduced, and the simplified expression of the radiation field of the array antennas is:

$$E_{array} = \frac{\eta}{4\pi k_0 \varepsilon_3} \times E_1 \times A$$

where $$E_1 = \int_{-h}^{h} G(\Delta\rho_1, \Delta z_1) I_1(z') dz'$$

is the radiation field generated by the first antenna in the array.

The present disclosure can be applied to important applications such as satellite-borne VLF underwater communication and navigation. Satellite-borne VLF launch is an important means of communication and navigation for underwater targets in the new generation. Using multiple space antennas to form a satellite-borne antenna array can effectively improve the antenna current moment and radiation efficiency. Therefore, accurate calculation of the radiation field and array factor of the satellite-borne array antennas in the ionosphere is of great guiding significance for optimizing system design, improving radiation efficiency and reducing the manufacturing cost in the satellite-borne VLF launch and propagation tests.

Corresponding to the embodiment of the method for calculating the radiation field of the satellite-borne array antennas, the present disclosure also provides an embodiment of a device for calculating the radiation field of the satellite-borne array antennas.

Figure 4:
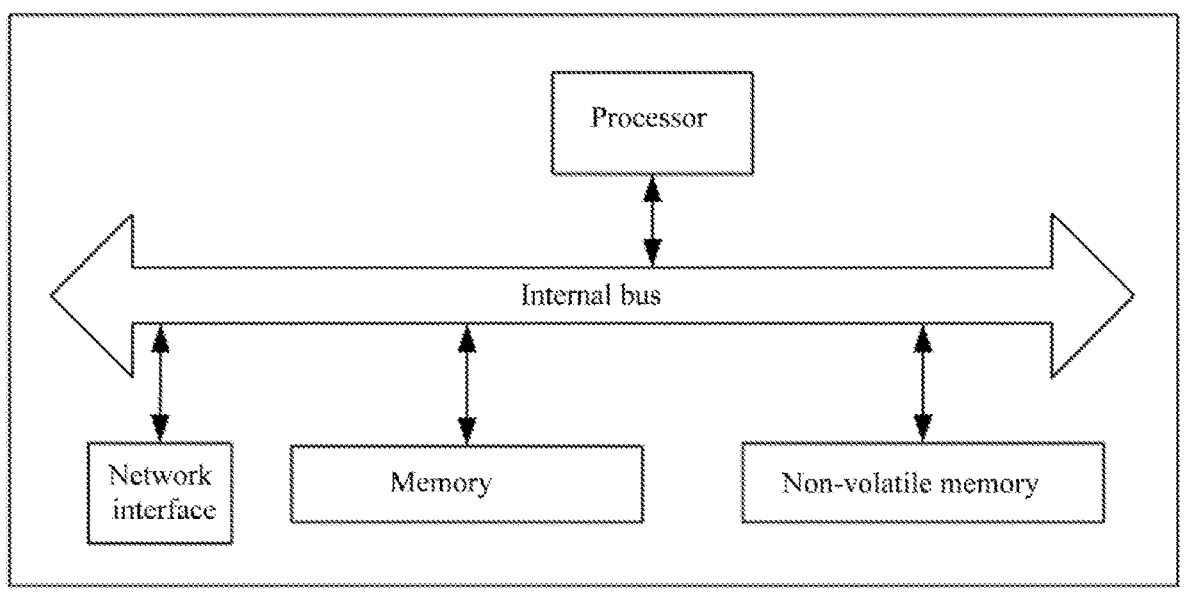
FIG. 4 is a hardware structure diagram of the present disclosure.

Referring to FIG. 4, a device for calculating the radiation field of satellite-borne array antennas provided by an embodiment of the present disclosure includes one or more processors for implementing the method for calculating the radiation field of the satellite-borne array antennas in the above embodiment.

An embodiment of a device for calculating the radiation field of satellite-borne array antennas of the present disclosure can be applied to any equipment with data processing capability, which can be a device or apparatus such as a computer. The embodiment of the device can be realized by software, or by hardware or a combination of hardware and software. Taking the software implementation as an example, as a logical device, it is formed by reading the corresponding computer program instructions in the nonvolatile memory into a memory through the processor of any equipment with data processing capability. From the hardware level, as shown in FIG. 4, it is a hardware structure diagram of any equipment with data processing capability where the device for calculating the radiation field of satellite-borne array antennas is located. In addition to the processor, memory, network interface and nonvolatile memory shown in FIG. 4, any equipment with data processing capability where the device is located in the embodiment usually includes other hardware according to the actual function of the equipment with data processing capability, which will not be described here again.

The implementing process of the functions and actions of each unit in the above-mentioned device is detailed in the implementing process of the corresponding steps in the above-mentioned method, and will not be repeated here.

For the device embodiment, since it basically corresponds to the method embodiment, it is only necessary to refer to part of the description of the method embodiment for the relevant points. The device embodiments described above are only schematic, in which the units described as separate components may or may not be physically separated, and the components displayed as units may or may not be physical units, that is, they may be located in one place or distributed to multiple network units. Some or all of the modules can be selected according to actual needs to achieve the purpose of the solution of the present disclosure. Those skilled in the art can understand and implement it without creative work.

An embodiment of the present disclosure further provides a computer-readable storage medium, on which a program is stored, and when executed by a processor, the program implements the method for calculating the radiation field of the satellite-borne array antennas in the above embodiment.

The computer-readable storage medium can be an internal storage unit of any equipment with data processing capability as described in any of the previous embodiments, such as a hard disk or a memory. The computer-readable storage medium can also be any equipment with data processing capability, such as a plug-in hard disk, a Smart Media Card (SMC), an SD card, a Flash Card and the like. Further, the computer-readable storage medium can also include both internal storage units and external storage devices of any equipment with data processing capability. The computer-readable storage medium is used for storing the computer program and other programs and data required by any equipment with data processing capability, and can also be used for temporarily storing data that has been output or will be output.

The above embodiments are only used to illustrate the design ideas and characteristics of the present disclosure with the purpose of enabling those skilled in the art to understand the contents of the present disclosure and implement it accordingly. The protection scope of the present disclosure is not limited to the above embodiments. Therefore, all equivalent changes or modifications made according to the principles and design ideas disclosed in the present disclosure shall be within the protection scope of the present disclosure.

What is claimed is:

1. A method for calculating the radiation field of a satellite-borne antenna array, which is applied to underwater communication and navigation, wherein the antenna array consists of N parallel linear antennas of the same size and operates at a frequency range of very-low-frequency (VLF), and the method comprises:

step (1) solving the radiation field excited by an electric dipole in an ionospheric environment, comprising:

calculating a kernel function of a antenna, namely the radiation field excited by the electric dipole in the ionospheric environment according to a relative position relationship between the electric dipole and an observation point, comprising:

calculating a relative transverse propagation distance $\Delta\rho$ and a relative longitudinal propagation distance $\Delta z$ between the observation point and the electric dipole, and performing a three-dimensional Fourier transform on a Maxwell's equation, to obtain the radiation field generated by the electric dipole at any position, wherein the radiation field generated by the electric dipole is equivalent to the radiation field generated by a current element on any antenna of the antenna array, that is, the expression of the radiation field of the electric dipole is the kernel function G ($\Delta\rho$, $\Delta z$) for each antenna of the antenna array in the ionospheric environment;

step (2) establishing N current integral equations satisfied by the antenna array in the ionospheric environment using the kernel function obtained in step (1) according to a boundary condition, and solving the N current integral equations to obtain a current distribution $I_i$ of each antenna of the antenna array, comprising:

calculating the current distribution of each antenna of the antenna array according to the following current integral equation:

$$\frac{\eta}{4\pi k_0 \varepsilon_3} \int_{-h}^{h} \sum_{i=1}^{N} G(b_{ki}, z-z') I_i(z') dz' = -V_k \delta(z)$$

wherein according to the boundary condition, an electric field tangential component on a surface of each antenna equals to zero everywhere and is equal to a feed voltage at an antenna feed point; and wherein $\eta$ represents a wave impedance in free space, $k_0$ represents a wave number in free space, $\varepsilon_3$ represents a diagonal component of a permittivity tensor of the ionosphere, $I_i$ represents a current distribution of an $i^{th}$ antenna of the antenna array, $V_k$ represents a feed voltage of a $k^{th}$ antenna of the antenna array, h represents a half-length of each antenna, $b_{ki}$ represents a transverse distance between the $k^{th}$ antenna and the $i^{th}$ antenna, z represents a longitudinal height of the observation point, z' represents a longitudinal height of the current element on the $i^{th}$ antenna, $\delta(z)$ represents a Dirac function and G represents the kernel function; and step (3) calculating the radiation field of each antenna of the antenna array according to the kernel function obtained in step (1) and the current distribution obtained in step (2), and calculating the total radiation field of the antenna array by summing the radiation field of all the antennas of the antenna array, the radiation field of each antenna is obtained by multiplying the current distribution by the kernel function and performing integration along the antenna length, and an expression for the total radiation field of the antenna array is:

$$E_{array} = \frac{\eta}{4\pi k_0 \varepsilon_3} \int_{-h}^{h} \sum_{i=1}^{N} G(\Delta\rho_i, \Delta z_i) I_i(z') dz'$$

where $\Delta\rho_i$ and $\Delta z_i$ are a relative transverse propagation distance and a relative longitudinal propagation distance between the current element, equivalent to an electric dipole, at location z' on the $i^{th}$ antenna and the observation point, respectively, $E_{array}$ represents the total radiation field of the antenna array, and component of the radiation field corresponds to a component of the kernel function G.

2. The method according to claim 1, wherein in step (2), the N current integral equations satisfied by the antenna array are solved via a moment method to obtain the current distribution $I_i$ of each antenna of the antenna array.

3. A device for calculating the radiation field of a satellite-borne antenna array, comprising one or more processors for implementing the method for calculating the radiation field of the satellite-borne antenna array according to claim 1.

4. A non-transient computer-readable storage medium, on which a program is stored, wherein the program, when executed by a processor, is configured to implement the method for calculating the radiation field of a satellite-borne antenna array according to claim 1.

* * * * *